US010503126B2

United States Patent
Ni et al.

(10) Patent No.: US 10,503,126 B2
(45) Date of Patent: Dec. 10, 2019

(54) ACCESS CONTROL METHOD FOR PARALLEL DIRECT CURRENT POWER SUPPLIES AND DEVICE THEREOF

(71) Applicant: SUNGROW POWER SUPPLY CO., LTD., Hefei, Anhui (CN)

(72) Inventors: Hua Ni, Anhui (CN); Shangfang Dai, Anhui (CN); Yanfei Yu, Anhui (CN); Zongjun Yang, Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 216 days.

(21) Appl. No.: 15/618,503

(22) Filed: Jun. 9, 2017

(65) Prior Publication Data
US 2017/0364040 A1   Dec. 21, 2017

(30) Foreign Application Priority Data
Jun. 21, 2016   (CN) .......................... 2016 1 0464032

(51) Int. Cl.
*H02S 50/00* (2014.01)
*G05B 9/02* (2006.01)
(Continued)

(52) U.S. Cl.
CPC .............. *G05B 9/02* (2013.01); *G01R 31/025* (2013.01); *G01R 31/026* (2013.01); *G01R 31/08* (2013.01);
(Continued)

(58) Field of Classification Search
CPC ........ G05B 9/02; G01R 31/026; G01R 31/08; G01R 31/025; G01R 31/04; G01R 31/041;
(Continued)

(56) References Cited

U.S. PATENT DOCUMENTS

2012/0126626 A1   5/2012   Falk et al.
2013/0307343 A1   11/2013   Behrends et al.

FOREIGN PATENT DOCUMENTS

CN   103048544 A   4/2013
CN   105356848 A   2/2016
(Continued)

OTHER PUBLICATIONS

"Insulation Resistance (Riso) of Non-Galvanically Isolated PV Plants," SMA Solar Technology AG; Version 2.2, pp. 1-5.
(Continued)

*Primary Examiner* — Jung Kim
(74) *Attorney, Agent, or Firm* — Cantor Colburn LLP (57) ABSTRACT

The application provides an access control method of parallel direct current power supplies and a device thereof. Direct current power supplies with single insulation resistances to ground failing to meet a first preset condition or causing a total insulation resistances to fail to meet a second preset condition are disconnected from a grid-connected inverter, and direct current power supplies with single insulation resistance to ground meeting the first preset condition and enabling the total insulation resistance to meet the second preset condition are connected with the grid-connected inverter for grid-connected inverting. Unlike in conventional technology, not all the direct current power supplies connected to a direct current bus are made stop outputting, thereby avoiding the loss of inverter power generation.

12 Claims, 4 Drawing Sheets

(51) Int. Cl.
*G01R 31/08* (2006.01)
*G01R 31/02* (2006.01)
*H02H 3/16* (2006.01)
*H02H 7/20* (2006.01)
*H02J 1/10* (2006.01)
*H02J 3/38* (2006.01)
*G01R 31/40* (2014.01)
*H02H 3/04* (2006.01)

(52) U.S. Cl.
CPC .............. *G01R 31/40* (2013.01); *H02H 3/16* (2013.01); *H02H 7/20* (2013.01); *H02J 1/10* (2013.01); *H02J 3/382* (2013.01); *H02J 3/383* (2013.01); *H02S 50/00* (2013.01); *H02H 3/042* (2013.01)

(58) Field of Classification Search
CPC ... H02J 3/382; H02J 1/10; H02H 7/20; H02H 3/16; H02H 3/042; H02H 7/00; H02H 3/00; H02H 3/04; H02S 50/00; H02S 50/10

See application file for complete search history.

(56) References Cited

FOREIGN PATENT DOCUMENTS

| | | |
|---|---|---|
| CN | 105652148 A | 6/2016 |
| EP | 2282388 A1 | 2/2011 |
| JP | 2005168156 A | 6/2005 |

OTHER PUBLICATIONS

Extended European Search Report corresponding to Application No. 17171238.3-1806; dated Jan. 12, 2017.

SIPO First Office Action corresponding to Application No. 201610464032.6; dated Apr. 3, 2018.

ACCESS CONTROL METHOD FOR PARALLEL DIRECT CURRENT POWER SUPPLIES AND DEVICE THEREOF

CROSS-REFERENCE TO RELATED APPLICATION

The present invention claims priority under 35 U.S.C. § 119 to Chinese Patent Application No. 201610464032.6, titled "ACCESS CONTROL METHOD FOR PARALLEL DIRECT CURRENT POWER SUPPLIES AND DEVICE THEREOF", filed on Jun. 21, 2016, which is hereby incorporated by reference in its entirety.

TECHNICAL FIELD

The present disclosure relates to the field of grid-connected power generation technology, and in particular to an access control method for parallel direct current power supplies and a device thereof.

BACKGROUND

In the field of current grid-connected photovoltaic power generation technology, multiple direct current power supplies are directly connected in parallel to a direct current bus of an inverter, or the multiple direct current power supplies may be connected to the direct current bus of the inverter through a DC-DC boost circuit.

When an insulation resistance to ground of one of the multiple direct current power supplies is too low, through an insulation resistance detection circuit, the inverter detects that an insulation resistance to ground of the system does not meet safety requirements, and for human safety, the inverter will stop and alarm.

This will cause all direct current power supplies connected in parallel to the direct current bus of the inverter to fail to output normally, which results in power generation loss of the inverter.

SUMMARY

In a view of the above, the present disclosure provides an access control method for parallel direct current power supplies and a device thereof, to solve the problem in conventional technology of power generation loss of the inverter caused by the fact that an insulation resistance to ground of an individual PV group does not meet requirements.

In order to achieve the above object, technical solutions are provided according to embodiments of the present disclosure as follows.

An access control method for parallel direct current power supplies includes:

S101, detecting single insulation resistances to ground of direct current power supplies;

S102, determining whether the single insulation resistances to ground each meets a first preset condition;

S103, controlling a direct current power supply, a single insulation resistance to ground of which does not meet the first preset condition, to be disconnected from a grid-connected inverter, and controlling a direct current power supply, a single insulation resistance to ground of which meets the first preset condition, to be connected with the grid-connected inverter, in a case that the single insulation resistances to ground do not all meet the first preset condition;

S104, detecting, after step S103 is performed or in a case that in step S102 all the single insulation resistances to ground meet the first preset condition, a total insulation resistance to ground of direct current power supplies currently in parallel;

S105, determining whether the total insulation resistance to ground meets a second preset condition;

S106, controlling, in a case that the total insulation resistance to ground does not meet the second preset condition, a direct current power supply, a single insulation resistance to ground of which is smallest of the direct current power supplies currently in parallel, to be disconnected from the grid-connected inverter; and repeatedly performing steps S104, S105 and S106 till the total insulation resistance to ground meets the second preset condition.

Preferably, before step S101, the method further includes:

S201, detecting an overall insulation resistance to ground of all the direct current power supplies when connected in parallel;

S202, determining whether the overall insulation resistance to ground meets the second preset condition;

S203, controlling, in a case that the overall insulation resistance to ground meets the second preset condition, to perform a grid-connected operation on the grid-connected inverter; and performing step S101 in a case that the overall insulation resistance to ground does not meet the second preset condition.

Preferably, the first preset condition and the second preset condition both are: being greater than (1K/V) Ω.

Preferably, the first preset condition and the second preset condition both are: being greater than $(V_{MAX\ PV}/30\text{ mA})$ Ω, where $V_{MAX\ PV}$ is the highest output voltage of the direct current power supplies.

An access control device for parallel direct current power supplies, applied to a grid-connected inverter, is provided. A direct current side of the grid-connected inverter is connected with n direct current power supplies in parallel via 2n switches. The access control device for the parallel direct current power supplies includes a control unit and an insulation resistance detection circuit, and n is positive integer greater than 1.

One ends of n of the 2n switches are connected with positive output terminals of the n direct current power supplies in a one-to-one correspondence. The other ends are connected with a positive input terminal of the insulation resistance detection circuit and a positive input terminal of the grid-connected inverter.

One ends of the other n of the 2n switches are connected with negative output terminals of the n direct current power supplies in a one-to-one correspondence. The other ends are connected with a negative input terminal of the insulation resistance detection circuit and a negative input terminal of the grid-connected inverter.

The insulation resistance detection circuit is configured to detect single insulation resistances to ground of the n direct current power supplies and a total insulation resistance to ground of direct current power supplies currently in parallel.

The control unit is configured to: control the 2n switches to be open or closed, and determine whether the single insulation resistances to ground meet a first preset condition; control each switch connected with a direct current power supply to be open in a case that the single insulation resistances to ground do not all meet the first preset condition, where a single insulation resistance to ground of the direct current power supply does not meet the first preset condition; control each switch connected with a direct current power supply to be closed, where a single insulation resistance to ground of the direct current power supply meets the first preset condition; determine whether the total insulation resistance to ground meets a second preset condition; control a switch connected with a direct current power supply to be open in a case that the total insulation resistance to ground does not meet the second preset condition, where a single insulation resistance to ground of the direct current power supply is smallest of the direct current power supplies currently in parallel; and repeatedly determine whether a total insulation resistance to ground of direct current power supplies currently in parallel meets the second preset condition, and control a switch connected with a direct current power supply to be open in a case that the total insulation resistance to ground does not meet the second preset condition, where a single insulation resistance to ground of the direct current power supply is smallest of the direct current power supplies currently in parallel, till the total insulation resistance to ground meets the second preset condition.

Preferably, the insulation resistance detection circuit is further configured to detect an overall insulation resistance to ground of all the direct current power supplies when connected in parallel.

The control unit is further configured to determine whether the overall insulation resistance to ground meets the second preset condition; and in a case that the overall insulation resistance to ground meets the second preset condition, perform a grid-connected operation on the grid-connected inverter.

Preferably, the control unit is further configured to output a corresponding direct current power failure warning signal when a switch is open.

A grid-connected inverter is provided, where a direct current side of the grid-connected inverter is connected with n direct current power supplies in parallel via 2n switches. The grid-connected inverter includes the access control device for the parallel direct current power supplies described above, or, the access control device for the parallel direct current power supplies described above is provided in the grid-connected inverter.

A grid-connected power generation system includes n direct current power supplies in parallel, 2n switches, a grid-connected inverter, a direct current side of which is connected with the n direct current power supplies in parallel via the 2n switches, and the access control device for the parallel direct current power supplies described above.

Preferably, the 2n switches and the insulation resistance detection circuit are provided in a combiner box, or the insulation resistance detection circuit and the control unit are provided in the grid-connected inverter.

The application provides an access control method for parallel direct current power supplies. Through steps S101 to S103, each direct current power supply is disconnected from the grid-connected inverter, where a single insulation resistance to ground of the direct current power supply does not meet the first preset condition. Through looping execution of steps S104 to S106, each direct current power supply, which causes the total insulation resistance to ground to fail to meet the second preset condition, is disconnected from the grid-connected inverter. And each direct current power supply, which has a single insulation resistance to ground meeting the first preset condition and causing the total insulation resistance to ground to meet the second preset condition, is connected with the grid-connected inverter to perform grid-connected inverting. Compared with the conventional technology, not all direct current power supplies connected in parallel with a direct current bus of the inverter stop outputting, thereby avoiding the loss of inverter power generation.

BRIEF DESCRIPTION OF THE DRAWINGS

The accompany drawings needed to be used in the description of the embodiments or the conventional technology are described briefly as follows, so that the technical solutions according to the embodiments in the present disclosure or according to the conventional technology become clearer. It is apparent that the accompany drawings in the following description are only some embodiments of the present disclosure. For those skilled in the art, other accompany drawings may be obtained according to these accompany drawings without any creative work.

DETAILED DESCRIPTION OF THE EMBODIMENTS

The technical solution according to the embodiments of the present disclosure will be described clearly and completely as follows in conjunction with the accompany drawings in the embodiments of the present disclosure. It is apparent that the described embodiments are only some rather than all of the embodiments of the invention. All the other embodiments obtained by those skilled in the art based on the embodiments in the present disclosure without any creative work fall within the scope of the present disclosure.

The present disclosure provides an access control method for parallel direct current power supplies, to solve the problem in conventional technology of power generation loss of the inverter caused by the fact that an insulation resistance to ground of an individual PV group does not meet requirements.

Figure 1:
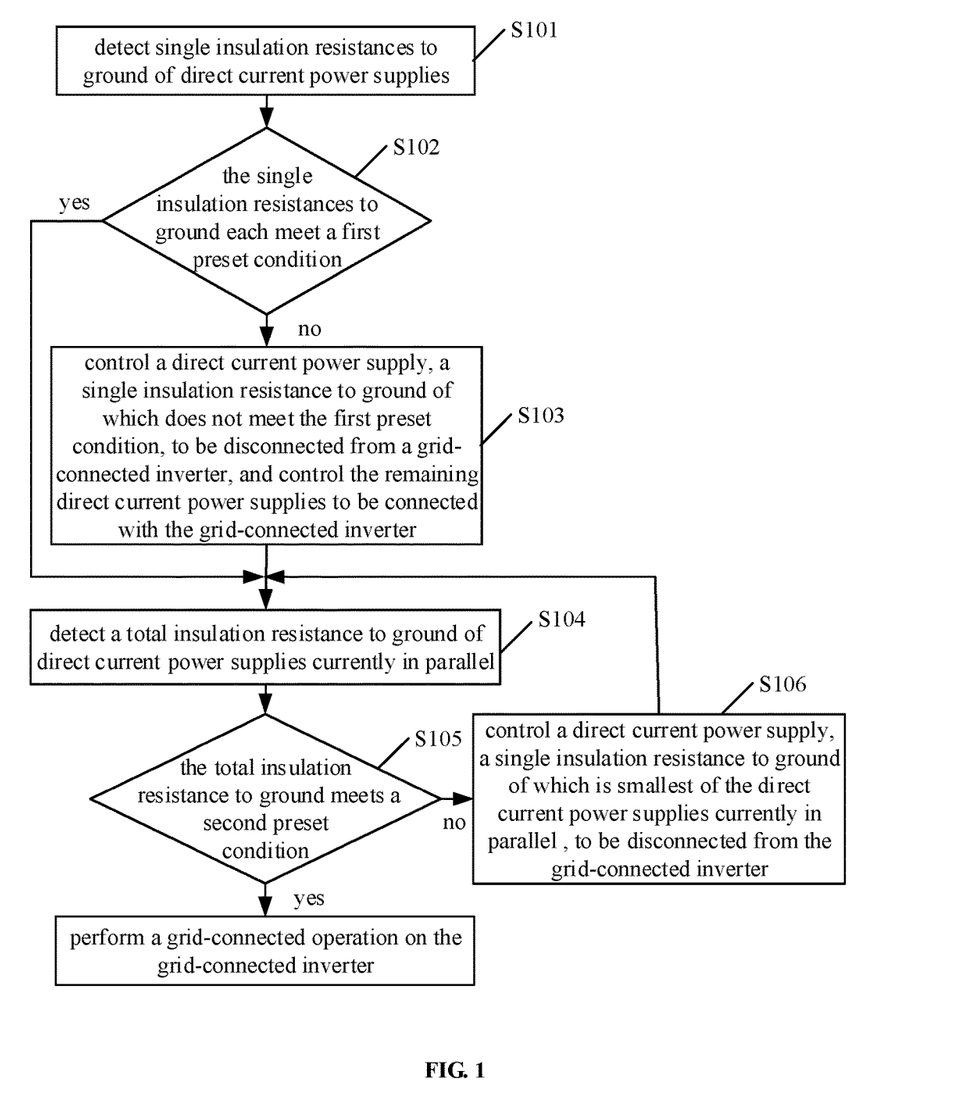
FIG. 1 is a flow chart of an access control method for parallel direct current power supplies according to an embodiment of the present disclosure.

Specifically, as shown in FIG. 1, the access control method for the parallel direct current power supplies includes steps S101 to S106.

In step S101, single insulation resistances to ground of direct current power supplies are detected.

Before a grid-connected operation is performed on a grid-connected inverter, it is necessary to perform a corresponding detection and judgment, in order to avoid a case of negative grounding of a direct current power supply. In specific application, a switch may be controlled to be closed or open, to connect or disconnect the direct current power supply and the grid-connected inverter.

In step S102, whether the single insulation resistances to ground meet a first preset condition is determined.

If there is a single insulation resistance to ground not meeting the first preset condition, it indicates that there is a ground fault on a direct current power supply.

If the single insulation resistances to ground do not all meet the first preset condition, step S103, which includes controlling each direct current power supply, a single insulation resistance to ground of which does not meet the first preset condition, to be disconnected from the grid-connected inverter (in specific application, an alarm may be given, to notify the relevant personnel to perform an overhaul), and controlling a direct current power supply, a single insulation resistance to ground of which meets the first preset condition, to be connected with the grid-connected inverter, is performed.

The direct current power supply, the single insulation resistance to ground of which meets the first preset condition, is connected with the grid-connected inverter, so that the grid-connected inverter may receive direct current power and have a basic power supply for a grid-connected operation. When the grid-connected inverter meets a grid-connected condition, the grid-connected operation is performed on the grid-connected inverter.

After step S103, step S104 of detecting a total insulation resistance to ground of direct current power supplies currently in parallel is performed.

Or, in step S102 the single insulation resistances to ground meet the first preset condition, step S104 is performed directly.

Then step S105 of determining whether the total insulation resistance to ground meets a second preset condition is performed.

If the total insulation resistance to ground does not meet the second preset condition, step S106 of controlling each direct current power supply, a single insulation resistance to ground of which is the smallest of direct current power supplies currently in parallel, to be disconnected from the grid-connected inverter is performed.

Steps S104, S105 and S106 are repeatedly performed till the total insulation resistance to ground meets the second preset condition.

Only in a case that direct current power supplies, a single insulation resistance to ground of each of which meets the first preset condition, are connected with the grid-connected inverter, step S104 is performed. If the total insulation resistance to ground does not meet the second preset condition, it indicates that there may be some direct current power supplies, single insulation resistances to ground of which meet the first preset condition, while connecting these direct current power supplies with the grid-connected inverter causes a total insulation resistance to ground of these direct current power supplies in parallel to fail to meet safety requirements. In this case, steps S104, S105 and S106 are performed repeatedly till the total insulation resistance to ground meets the second preset condition. For example, in specific application, when open-circuit voltages of two direct current power supply are both 1000V, single insulation resistances to ground are respectively 2M and 1.5M, which are both greater than a safety threshold (such as 1M) and meet safety requirements. When the two direct current power supplies are connected in parallel, a total insulation resistance to ground, that is a parallel value of 2M and 1.5M, is 0.86 M, which does not meet the safety requirements. Therefore, steps S104, S104 and S106 shown in FIG. 2 are performed repeatedly to eliminate a direct current power supply, a single insulation resistance to ground of which meets the safety requirements and parallel connecting of which causes the total insulation resistance to ground of the whole system to fail to meet the safety requirements.

In the access control method for the parallel direct current power supplies according to the embodiment of the present disclosure, through the above process, a direct current power supply is disconnected from a grid-connected inverter, where a single insulation resistance to ground of the direct current power supply does not meet the first preset condition, or the direct current power supply does not enable a total insulation resistance to ground to meet the second preset condition. And a direct current power supply is connected with the grid-connected inverter to perform grid-connected inverting, where a single insulation resistance to ground of the direct current power supply meets the first preset condition, and the direct current power supply enables the total insulation resistance to ground to meet the second preset condition. In this way, not all direct current power supplies connected in parallel with a direct current bus of the inverter stop outputting, thereby avoiding the loss of inverter power generation.

It is noted that the direct current power supply may be a series of photovoltaic modules, or a wind-driven generator, which is not limited herein and is within the scope of the present disclosure.

Figure 2:
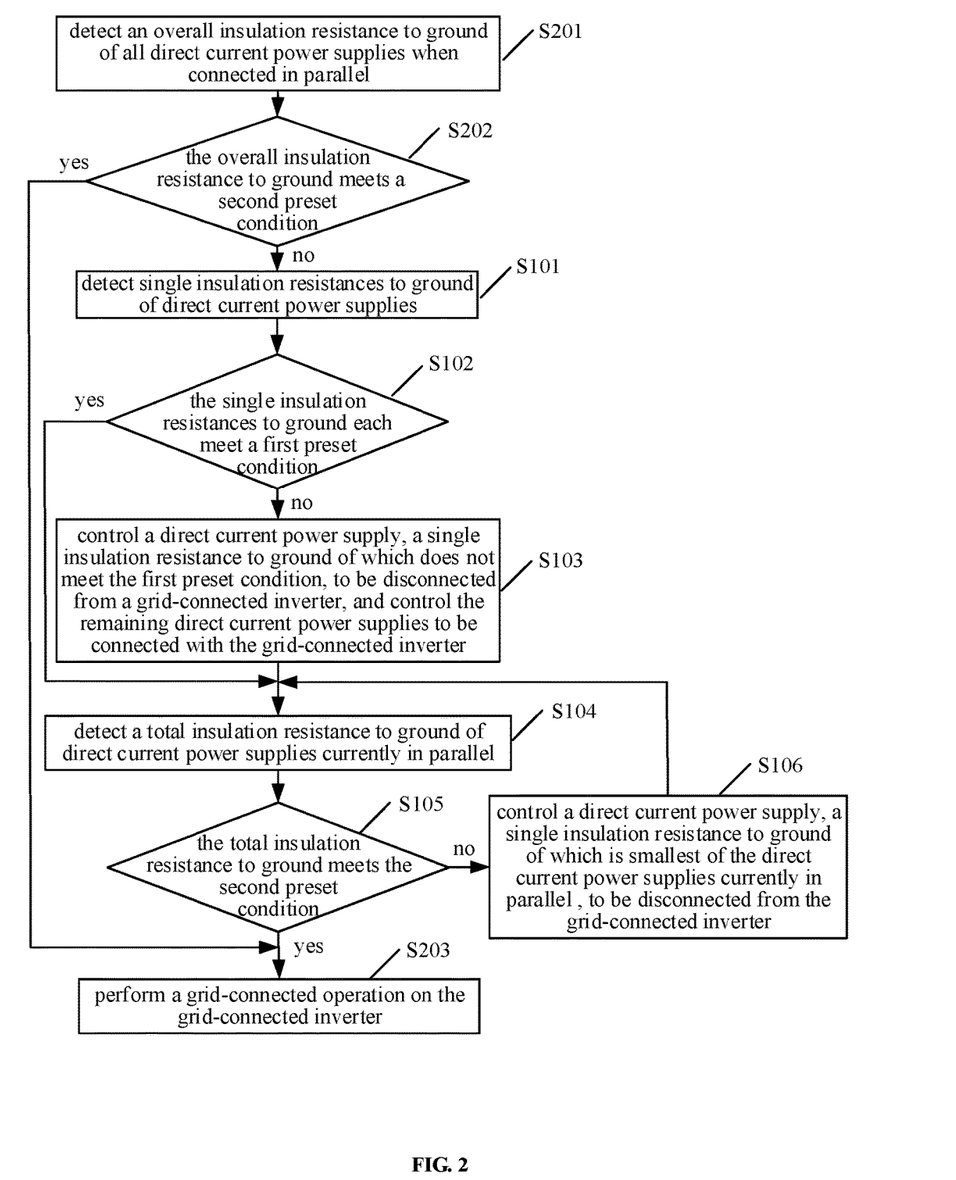
FIG. 2 is a flow chart of an access control method for parallel direct current power supplies according to another embodiment of the present disclosure.

According to another preferred embodiment of the present disclosure as shown in FIG. 2, before step S101 the method further includes steps S201 to S203.

In step S201, an overall insulation resistance to ground of all direct current power supplies in parallel is detected.

In step S202, whether the overall insulation resistance to ground meets the second preset condition is determined.

If the overall insulation resistance to ground meets the second preset condition, step S203 of performing a grid-connected operation on the grid-connected inverter is performed.

Only in a case that the overall insulation resistance to ground does not meet the second preset condition, step S101 is performed.

In practice, the access control method for the parallel direct current power supplies shown in FIG. 2 may be used to prevent unnecessary detection on each direct current power supply before grid-connected operation.

In the above embodiments, preferably, the first preset condition and the second preset condition both are: being greater than (1K/V) Ω, or greater than ($V_{MAX\,PV}$/30 mA) Ω, and $V_{MAX\,PV}$ is the largest output voltage of the direct current power supplies.

A specific setting of the first preset condition and the second preset condition may be determined according to actual application environment, which is not limited herein and is within the scope of the present disclosure.

Figure 3:
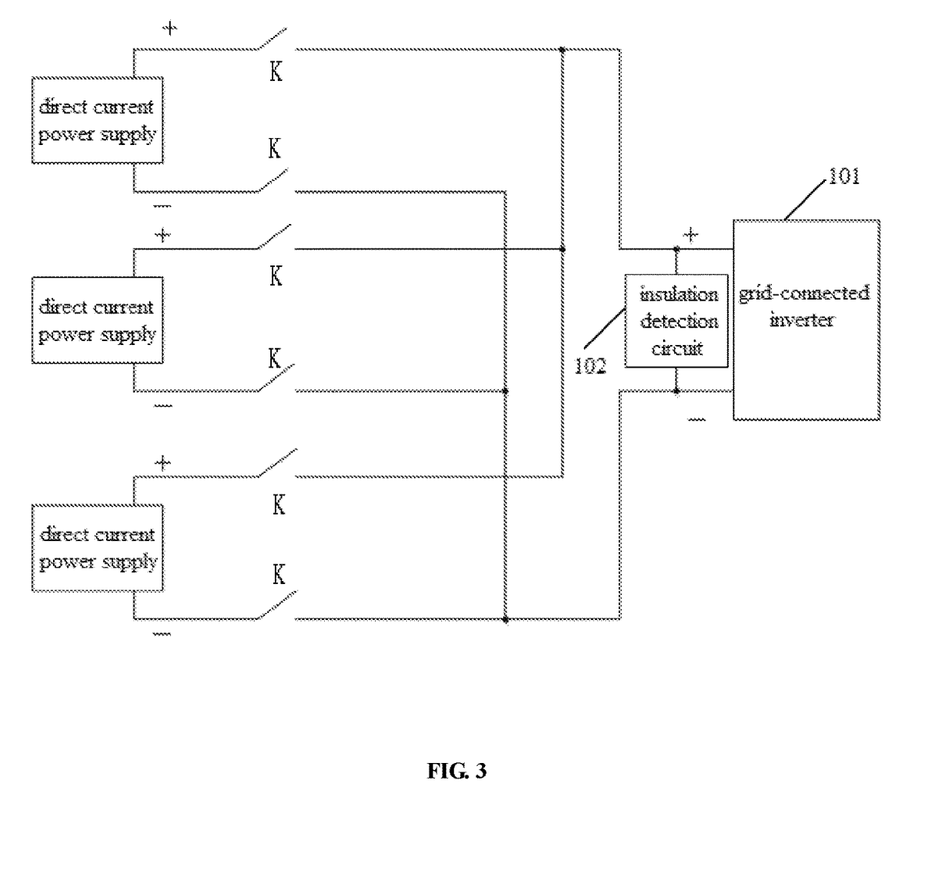
FIG. 3 is a structural diagram of a grid-connected power generation system according to an embodiment of the present disclosure.

An access control device for parallel direct current power supplies is provided according to another embodiment of the present disclosure. And the access control device is applied to a grid-connected inverter 101. A direct current side of the grid-connected inverter 101 is connected with n direct current power supplies in parallel via 2n switches K. As shown in FIG. 3, the access control device for the parallel direct current power supplies includes a control unit and an insulation resistance detection circuit 102, and n is positive integer greater than 1.

One ends of n switches K are connected with positive output terminals of the n direct current power supplies in a one-to-one correspondence. The other ends are connected with a positive input terminal of the insulation resistance detection circuit 102 and a positive input terminal of the grid-connected inverter 101.

One ends of the other n switches K are connected with negative output terminals of the n direct current power supplies in a one-to-one correspondence. The other ends are connected with a negative input terminal of the insulation resistance detection circuit 102 and a negative input terminal of the grid-connected inverter 101.

An operating principle is described as follows.

The insulation resistance detection circuit 102 is configured to detect single insulation resistances to ground of the n direct current power supplies and a total insulation resistance to ground of direct current power supplies currently in parallel.

The control unit is configured to: control the 2n switches K to be open or closed, and determine whether the single insulation resistances to ground each meet a first preset condition; control each switch K connected with a direct current power supply to be open in a case that the single insulation resistances to ground do not all meet the first preset condition, where a single insulation resistance to ground of the direct current power supply does not meet the first preset condition; control each switch K connected with a direct current power supply to be closed, where a single insulation resistance to ground of the direct current power supply meets the first preset condition; determine whether the total insulation resistance to ground meets a second preset condition; control a switch K connected with a direct current power supply to be open in a case that the total insulation resistance to ground does not meet the second preset condition, where a single insulation resistance to ground of the direct current power supply is the smallest of the direct current power supplies in parallel currently; and repeatedly determine whether a total insulation resistance to ground of direct current power supplies currently in parallel meets the second preset condition, and control a switch connected with a direct current power supply to be open in a case that the total insulation resistance to ground does not meet the second preset condition, where a single insulation resistance to ground of the direct current power supply is the smallest of the direct current power supplies currently in parallel, till the total insulation resistance to ground meets the second preset condition.

Preferably, the insulation resistance detection circuit 102 is further configured to detect an overall insulation resistance to ground of all the direct current power supplies when connected in parallel.

The control unit is further configured to determine whether the overall insulation resistance to ground meets the second preset condition. If the overall insulation resistance to ground meets the second preset condition, a grid-connected operation is performed on the grid-connected inverter.

Figure 4:
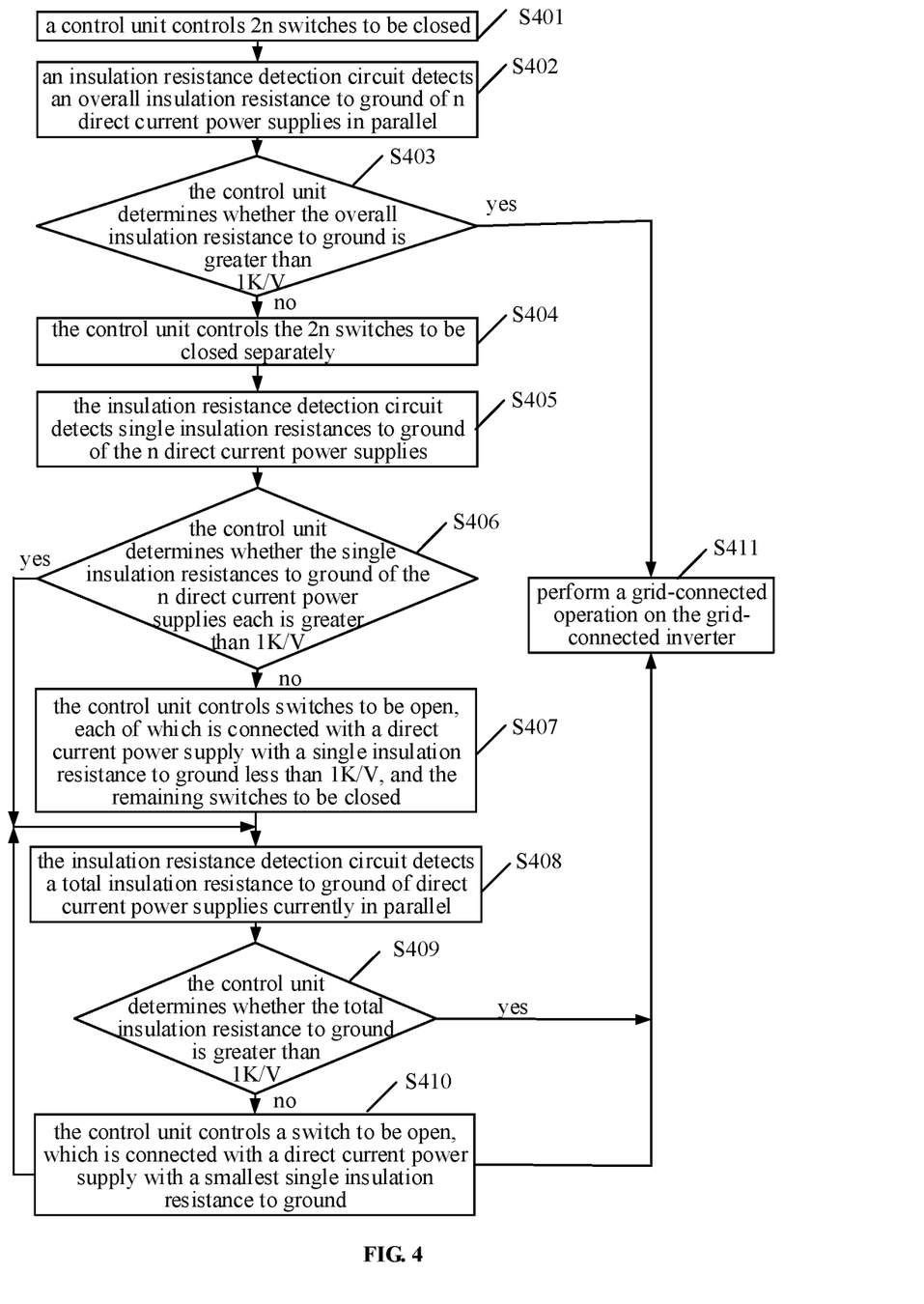
FIG. 4 is a flow chart of an access control method for parallel direct current power supplies according to another embodiment of the present disclosure.

Combined with the access control method for the parallel direct current power supplies according to the above embodiments of the present disclosure, reference is made to FIG. 4 for a specific operating process of the access control device for the parallel direct current power supplies.

In step S401, the control unit controls the 2n switches to be closed.

In step S402, the insulation resistance detection circuit detects the overall insulation resistance to ground of n direct current power supplies in parallel.

In step S403, the control unit determines whether the overall insulation resistance to ground is greater than 1K/V.

If the overall insulation resistance to ground is greater than 1K/V, step S711 is performed.

If the overall insulation resistance to ground is less than 1K/V, step S404 in which the control unit controls the 2n switches to be closed separately is performed.

In step S405, the insulation resistance detection circuit detects a single insulation resistance to ground of each of then direct current power supplies.

In step S406, the control unit determines whether the single insulation resistance to ground of each of then direct current power supplies is greater than 1K/V.

If single insulation resistances to ground of the n direct current power supplies are not all greater than 1K/V, step S407 in which the control unit controls switches to be open, each of which is connected with a direct current power supply with a single insulation resistance to ground less than 1K/V, and the control unit controls the remaining switches to be closed is performed.

Then step S408 in which the insulation resistance detection circuit detects a total insulation resistance to ground of direct current power supplies currently in parallel is performed.

If the single insulation resistance to ground of each of the n direct current power supplies is greater than 1K/V, step S408 is performed directly.

In step S409, the control unit determines whether the total insulation resistance to ground is greater than 1K/V.

If the total insulation resistance to ground is less than 1K/V, step S410 is performed, in which the control unit controls a switch connected with a direct current power supply with a smallest single insulation resistance to ground to be open.

Steps S408 and S409 are performed repeatedly till the total insulation resistance to ground is greater than 1K/V. Then step S411 is performed, in which the control unit performs a grid-connected operation on the grid-connected inverter.

Preferably, the control unit is further configured to output a corresponding direct current power failure warning signal when a switch K is open.

The direct current power failure warning signal may notify the relevant personnel to perform an overhaul on a corresponding fault direct current power supply, to increase power generation of the grid-connected inverter.

A grid-connected inverter is provided according to another embodiment of the present disclosure. As shown in FIG. 3, a direct current side of the grid-connected inverter 101 is connected with n direct current power supplies in parallel via 2n switches K. The grid-connected inverter 101 includes the access control device for the parallel direct current power supplies according to the above embodiments, or, the access control device for the parallel direct current power supplies according to the above embodiments is provided in the grid-connected inverter 101.

In practice, the grid-connected inverter 101 may include a filter unit and a control module for performing maximum power point tracking control, which is not described herein.

A specific connection relationship and an operating principle are the same as those of the above embodiments, which are not described herein.

A grid-connected power generation system is provided according to another embodiment of the present disclosure. As shown in FIG. 3, the grid-connected power generation system includes n direct current power supplies in parallel, 2n switches K, a grid-connected inverter 101, a direct current side of which is connected with the n direct current power supplies in parallel via the 2n switches K, and the access control device for the parallel direct current power supplies according to the above embodiments.

Preferably, the 2n switches K and the insulation resistance detection circuit 102 are provided in a combiner box, or the insulation resistance detection circuit 102 and the control unit are provided in the grid-connected inverter 101.

In specific application, the grid-connected inverter 101, the control unit and the insulation resistance detection circuit 102 may be integrated in the grid-connected inverter 101. Then comparisons of various data and controls of switches K may be performed by the grid-connected inverter 101.

Or, the 2n switches K and the insulation resistance detection circuit 102 may be integrated in a combiner box. Then the control unit is a single controller to perform the above functions.

Practically, the number of the grid-connected inverter 101 is not limited, and the grid-connected power generation system may include multiple cascaded grid-connected inverters 101, where an input terminal of each grid-connected inverter 101 is connected with multiple direct current power supplies in parallel.

The embodiments of the present disclosure are described herein in a progressive manner, with an emphasis placed on explaining the difference between each embodiment and the other embodiments; hence, for the same or similar parts among the embodiments, reference can be made to each other. For the device disclosed in the embodiments, brief descriptions are made for it corresponds to the methods disclosed in the embodiments, and reference can be made to the methods for relevant descriptions.

The above description of the embodiments disclosed herein enables those skilled in the art to implement or use the present disclosure. Numerous modifications to the embodiments will be obvious to those skilled in the art, and the general principle herein can be implemented in other embodiments without deviation from the spirit or scope of the embodiments of the present disclosure. Therefore, the present disclosure will not be limited to the embodiments described herein, but in accordance with the widest scope consistent with the principle and novel features disclosed herein.

The invention claimed is:

1. An access control method for parallel direct current power supplies, performed by an access control device for parallel direct current power supplies which is applied to a grid-connected inverter, wherein,
   a direct current side of the grid-connected inverter is connected with n direct current power supplies in parallel via 2n switches; and
   the access control device for the parallel direct current power supplies comprises: a control unit and an insulation resistance detection circuit, and n is a positive integer greater than 1; wherein,
      one ends of n of the 2n switches are connected with positive output terminals of the n direct current power supplies in a one-to-one correspondence, and the other ends are connected with a positive input terminal of the insulation resistance detection circuit and a positive input terminal of the grid-connected inverter;
      one ends of the other n of the 2n switches are connected with negative output terminals of the n direct current power supplies in a one-to-one correspondence, and the other ends are connected with a negative input terminal of the insulation resistance detection circuit and a negative input terminal of the grid-connected inverter;
   wherein the method comprises:
   S101, detecting, by the insulation resistance detection circuit, values of single insulation resistances to ground of the n direct current power supplies;
   S102, determining, by the control unit, whether values of the single insulation resistances to ground each are greater than a first threshold;
   S103, controlling, by the control unit, each switch connected with a direct current power supply, a value of a single insulation resistance to ground of which is not greater than the first threshold, to be open, and controlling each switch connected with a direct current power supply, a value of a single insulation resistance to ground of which is greater than the first threshold, to be closed, in response to determining that the values of the single insulation resistances to ground are not all greater than the first threshold;
   S104, detecting, by the insulation resistance detection circuit, a value of a total insulation resistance to ground of direct current power supplies currently in parallel, after step S103 is performed or in a case that in step S102 all the values of the single insulation resistances to ground is greater than the first threshold;
   S105, determining, by the control unit, whether the value of the total insulation resistance to ground is greater than a second threshold different than the first threshold;
   S106, controlling, by the control unit, a switch connected with a direct current power supply, a value of a single insulation resistance to ground of which is smallest of the direct current power supplies that are currently in parallel and have the values of the single insulation resistances to ground all greater than the first threshold, to be open, in response to determining that the value of the total insulation resistance to ground is not greater than the second threshold; and
   repeatedly performing steps S104, S105 and S106 till the value of the total insulation resistance to ground of direct current power supplies currently in parallel is greater than the second threshold.

2. The access control method for the parallel direct current power supplies according to claim 1, wherein before step S101, the method further comprises:
   S201, detecting a value of an overall insulation resistance to ground of all the direct current power supplies when connected in parallel;
   S202, determining whether the value of the overall insulation resistance to ground is greater than the second threshold; and
   S203, performing a grid-connected operation on the grid-connected inverter, in a case that the value of the overall insulation resistance to ground is greater than the second threshold, wherein,
   step S101 is performed only in a case that the value of the overall insulation resistance to ground is not greater than the second threshold.

3. The access control method for the parallel direct current power supplies according to claim 1, wherein the first threshold and the second threshold both are: (1K/V) $\Omega$.

4. The access control method for the parallel direct current power supplies according to claim 2, wherein the first threshold and the second threshold both are: (1K/V) $\Omega$.

5. The access control method for the parallel direct current power supplies according to claim 1, wherein the first threshold and the second threshold both are: ($V_{MAX\ PV}$/30 mA) $\Omega$, and $V_{MAX\ PV}$ is the highest output voltage in direct current power supplies.

6. The access control method for the parallel direct current power supplies according to claim 2, wherein the first threshold and the second threshold both are: ($V_{MAX\ PV}$/30 mA) $\Omega$, and $V_{MAX\ PV}$ is the highest output voltage in direct current power supplies.

7. An access control device for parallel direct current power supplies, applied to a grid-connected inverter, wherein,
 a direct current side of the grid-connected inverter is connected with n direct current power supplies in parallel via 2n switches; and
 the access control device for the parallel direct current power supplies comprises: a control unit and an insulation resistance detection circuit, and n is a positive integer greater than 1; wherein,
  one ends of n of the 2n switches are connected with positive output terminals of the n direct current power supplies in a one-to-one correspondence, and the other ends are connected with a positive input terminal of the insulation resistance detection circuit and a positive input terminal of the grid-connected inverter;
  one ends of the other n of the 2n switches are connected with negative output terminals of the n direct current power supplies in a one-to-one correspondence, and the other ends are connected with a negative input terminal of the insulation resistance detection circuit and a negative input terminal of the grid-connected inverter;
  the insulation resistance detection circuit is configured to detect values of single insulation resistances to ground of the n direct current power supplies and a value of a total insulation resistance to ground of direct current power supplies currently in parallel; and
  the control unit is configured to:
  determine whether the values of the single insulation resistance to ground of the n direct current power supplies each are greater than a first threshold; in response to determining that the values of the single insulation resistances to ground of the n direct current power supplies are not greater than the first threshold, control each switch connected with a direct current power supply, a value of a single insulation resistance to ground of which is not greater than the first threshold, to be open and control each switch connected with a direct current power supply, a value of a single insulation resistance to ground of which is greater than the first threshold, to be closed; determine whether the value of the total insulation resistance to ground of direct current power supplies currently in parallel is greater than a second threshold different than the first threshold, in response to the controlling of each switch; control, in response to determining that the value of the total insulation resistance to ground is not greater than the second threshold, a switch connected with a direct current power supply, a value of a single insulation resistance to ground of which is smallest of the direct current power supplies that are currently in parallel and have the values of the single insulation resistances to ground all greater than the first threshold, to be open; and repeatedly determine whether a value of a total insulation resistance to ground of direct current power supplies currently in parallel is greater than the second threshold, and control, in response to determining that the value of the total insulation resistance to ground is not greater than the second threshold, a switch connected with a direct current power supply, a value of a single insulation resistance to ground of which is smallest of the direct current power supplies that are currently in parallel and have the values of the single insulation resistances to ground all greater than the first threshold, to be open, till the value of the total insulation resistance to ground of the direct current power supplies currently in parallel is greater than the second threshold.

8. The access control device for the parallel direct current power supplies according to claim 7, wherein,
 the insulation resistance detection circuit is further configured to detect a value of an overall insulation resistance to ground of all the direct current power supplies when connected in parallel; and
 the control unit is further configured to determine whether the value of the overall insulation resistance to ground is greater than the second threshold, and in response to determining that the value of the overall insulation resistance to ground is greater than the second threshold, perform a grid-connected operation on the grid-connected inverter.

9. The access control device for the parallel direct current power supplies according to claim 7, wherein the control unit is further configured to output a corresponding direct current power failure warning signal when a switch is open.

10. A grid-connected inverter, wherein,
 a direct current side of the grid-connected inverter is connected with n direct current power supplies in parallel via 2n switches; and
 the grid-connected inverter comprises the access control device for the parallel direct current power supplies according to claim 7, or the access control device for the parallel direct current power supplies according to claim 7 is provided in the grid-connected inverter.

11. A grid-connected power generation system, comprising n direct current power supplies in parallel, 2n switches, a grid-connected inverter, a direct current side of which is connected with the n direct current power supplies in parallel via the 2n switches, and the access control device for the parallel direct current power supplies according to claim 7.

12. The grid-connected power generation system according to claim 11, wherein the 2n switches and the insulation resistance detection circuit are provided in a combiner box, or the insulation resistance detection circuit and the control unit are provided in the grid-connected inverter.

* * * * *